United States Patent [19]

Isaacs et al.

[11] 3,940,717
[45] Feb. 24, 1976

[54] ACOUSTIC SURFACE WAVE DEVICES USING $Tl_3TaS_4$ AND $Tl_3TaSe_4$ CRYSTALS

[75] Inventors: Thelma J. Isaacs, Murrysville; Robert W. Weinert, Monroeville, both of Pa.

[73] Assignee: Westinghouse Electric Corporation, Pittsburgh, Pa.

[22] Filed: Jan. 10, 1975

[21] Appl. No.: 540,193

[52] U.S. Cl.................. 333/30 R; 310/9.5; 333/72
[51] Int. Cl.² H03H 9/26; H03H 9/30; H01L 41/08; H01L 41/18
[58] Field of Search......... 333/30 R, 72; 310/8, 8.1, 310/9.7, 9.8, 9.5; 252/62.9 R

[56] References Cited
UNITED STATES PATENTS
3,818,382  6/1974  Holland et al. .............. 333/30 R X OTHER PUBLICATIONS
Čermák–Width of the Energy Gap of Some Ternary Thallium Chalcogenides in Collection Czechoslov Chem. Commun Vol. 34, 1969; pp. 3605–3609.

*Primary Examiner*—Archie R. Borchelt
*Assistant Examiner*—Marvin Nussbaum
*Attorney, Agent, or Firm*—R. D. Fuerle

[57] ABSTRACT

An acoustic surface wave device is disclosed which comprises a crystal of $Tl_3TaS_4$, $Tl_3TaSe_4$, or mixtures thereof having at least one surface suitable for the propagation of surface waves, a surface wave generating transducer mounted on the surface, and a surface wave receiving transducer mounted on the surface positioned to receive a surface wave generated by the surface wave generating transducer.

The device transmits surface waves at a low velocity and high coupling efficiency and can be used in a delay line, a filter, an FM discriminator, an oscillator, or other device.

15 Claims, 1 Drawing Figure

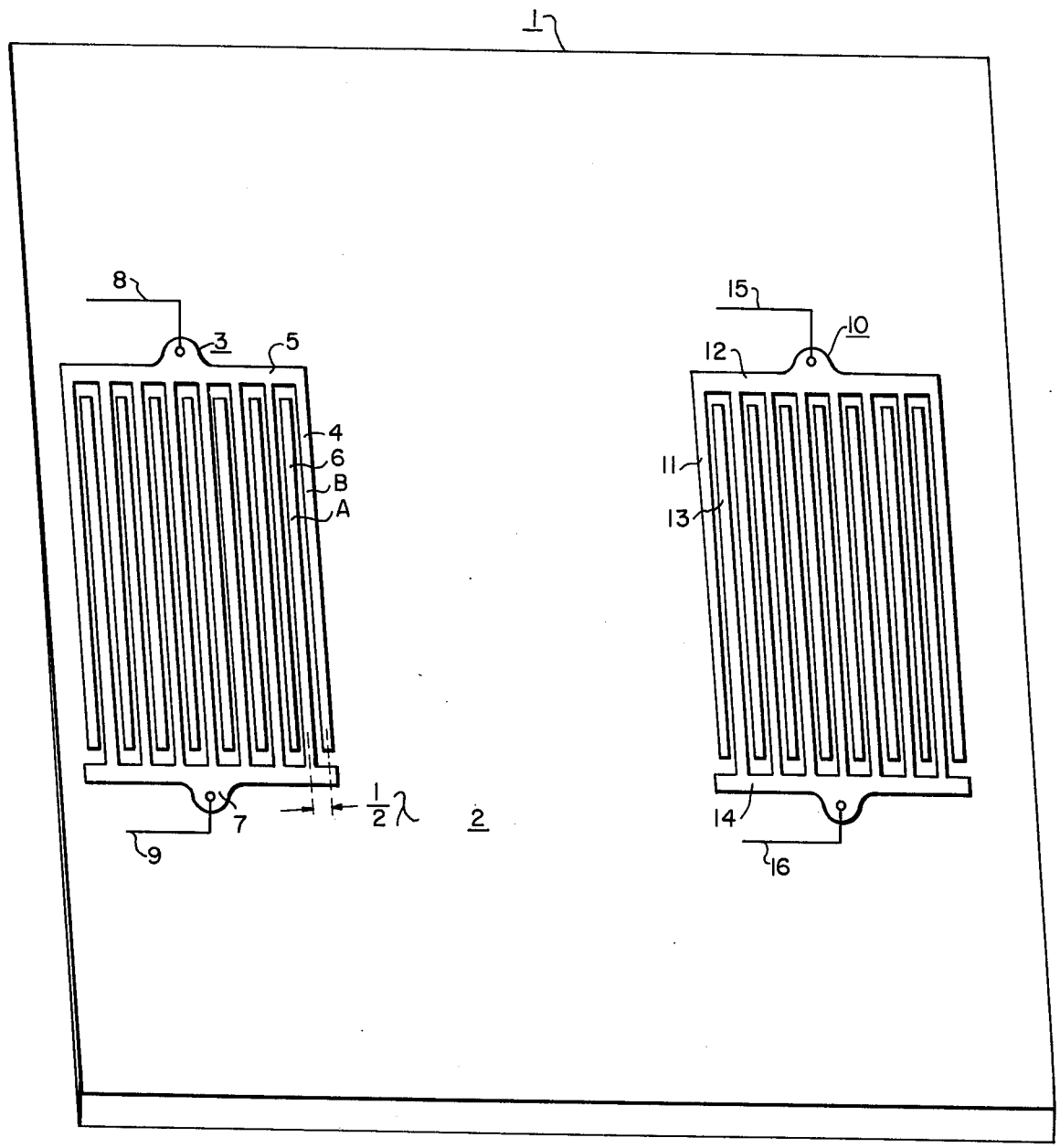

3,940,717

ACOUSTIC SURFACE WAVE DEVICES USING TL₃TAS₄ AND TL₃TASE₄ CRYSTALS

| Material | Orientation | Velocity 10⁵ cm/sec | Delay μsec/mm | Temperature Coefficient of Delay ppm/°C | Coupling Strength $K^2(\%)$ | Optimum No. of Finger Pairs | Effective Dielectric Constant |
|---|---|---|---|---|---|---|---|
| LiNbO₃ | YZ | 3.40 | 0.29 | +93 | 4.8 | 4.5 | 50 |
| Bi₁₂GeO₂₀ | (112),(111) | 1.72 | 0.58 | +112 | 0.46 | 13 | 11 |
| SiO₂ | YX | 3.16 | 0.32 | −25 | 0.18 | 21 | 4.3 |
| Tl₃VS₄ | (001),(110) | 0.87 | 1.15 | −54 | 1.39 | 7.5 (calculated) | 14 |

Additional information about surface waves can be found in a January 1971 article in Vol. 9, No. 1 of Ultrasonics by John de Klerk titled "Ultrasonic Transducers 3. Surface Wave Transducers" and in a November 1972 article in Vol. 25, No. 11 Physics Today by John de Klerk titled "Elastic Surface Waves".

CROSS-REFERENCE TO RELATED APPLICATION

This application is related to application Ser. No. 463,337, filed Apr. 23, 1974, by T. J. Isaacs, and M. R. Daniel titled "Acoustic Surface Wave Device." That application describes surface wave devices which use crystals of Tl₃VS₄, Tl₃NbS₄, and mixtures thereof.

This application is also related to application Ser. No. 540,194, filed the same date as this application by R. W. Weinert and T. J. Isaacs titled "Crystals Having Zero Temperature Coefficients of Delay." That application describes crystals of Tl₃VS₄, Tl₃VSe₄, Tl₃NbS₄, Tl₃NbSe₄, Tl₃TaS₄, and Tl₃TaSe₄ which have surfaces containing or normal to a zero temperature coefficient of delay direction.

This application is also related to application Ser. No. 540,192, filed the same date as this application by T. J. Isaacs and M. Gottlieb titled "Tl₃TaS₄ and Tl₃TaSe₄ Crystals and Acousto-Optical Devices." This application is related to application Ser. No. 392,695, filed Aug. 29, 1973 entitled "Tl₃VS₄ and Tl₃NbS₄ Crystals and Acousto-Optical Devices."

BACKGROUND OF THE INVENTION

Acoustic surface waves usually travel across the surfaces of a signal crystal material at a slower rate than acoustic bulk waves can travel through the crystal. For this reason, a greater delay time can be achieved in a smaller crystal by a surface wave than by a bulk wave.

For certain applications a good acoustic surface wave material should have a low acoustic velocity relative to other materials. It should also have large coupling strength, which is a measurement of the amount of electrical energy required to generate a surface wave of a given energy.

Another property of a good acoustic surface wave material is a low optimum number of finger pairs. The optimum number of finger pairs (in the transducer) is the minimum number which can be used without the loss of energy (insertion loss) due to the generation of bulk waves in the crystal. Bulk waves would be received at the receiving transducer and would confuse the signal. Since the bandwidths of the generated and received signals are equal to the inverse of the number of finger pairs in the generating and receiving transducers, a small optimum number of finger pairs permits a wider selection of bandwidths.

Still another important property is a low temperature coefficient of delay. As the temperature of the crystal increases, the delay of the surface wave will either increase (a positive coefficient) or decrease (a negative coefficient). The delay of a surface wave in a good material should not be affected very much by temperature and therefore should have a temperature coefficient which is close to zero.

The following table gives the properties of some better known acoustic surface wave materials:

PRIOR ART

An article entitled "Magnetic Susceptibility of Ternary Compounds Tl₃VS₄ and Tl₃TaS₄" by M. Matyas and K. Cermak appears on pages 1305 and 1306 of the Czechoslovakian Journal of Physics (1969).

An article entitled "Luminescence Spectra of Ternary Compounds of Tl₃BX₄ Type" By N. A. Goryunova, V. M. Orlov, V. A. Sokolova, E. V. Tsvetkova, and Yu. G. Shreter appears on pages K127 and K128 of Physicis Status Solidi (1972).

An article entitled "Some Ternary Thallium Chalcogenides" by C. Crevecoeur appears in the January - June 1964 volume (Volume No. 17) of Acta Crystallographica on page 757. That article describes the preparation and characteristics of the isomorphous compounds Tl₃VS₄, Tl₃NbS₄, Tl₃TaS₄, Tl₃VSe₄, and Tl₃NbSe₄, and Tl₃TaSe₄. Large, single crystals were not prepared and acoustic properties are not mentioned.

SUMMARY OF THE INVENTION

We have discovered acoustic surface wave devices using crystals of Tl₃TaS₄, Tl₃TaSe₄, or mixtures thereof, have some properties which are superior to devices using the best-known prior art materials.

For example, Tl₃TaS₄ has a very high coupling strength, second only to LiNbO₃. However, Tl₃TaS₄ has a much lower velocity than LiNbO₃ and it also has zero temperature coefficient of delay (ZTCD) directions, which LiNbO₃ does not.

The Tl₃TaSe₃ crystal has ZTCD delay direction in the 110 direction which make it easy to orientate the crystal to take advantage of this property. It also has a zero power flow angle in that direction so the design of devices is simpler because grids need not be offset.

Both crystals display the low velocities of the Tl₃VS₄ crystal, and together these three crystals, to the best of our knowledge, have the lowest acoustic surface wave velocities of any known crystalline surface wave material.

These properties make the device suitable for use as a delay line, a filter, an FM modulator, an oscillator, or in other applications.

DESCRIPTION OF THE INVENTION

The accompanying drawing is an isometric view of an embodiment of an acoustic surface wave device according to this invention.

In the drawing, a crystal of Tl₃TaS₄, Tl₃TaSe₄, or mixtures thereof, is shown which has a suitable surface 2 for the propagation of surface waves. Mounted on this surface is surface wave generating transducer 3.

While any type of surface wave generating transducer may be used, an interdigitated transducer, as shown in the drawing, is preferred since it is known to perform well. The transducer is made up of fingers 4, connected by bar 5, which alternate with fingers 6, connected by bar 7. Ordinarily, all the fingers are of the same width and length although other designs may also be used. Wires 8 and 9 are connected to bars 5 and 7, respectively. An electrical signal sent through wires 8 and 9 results in the generation of an acoustic surface wave moving across the crystal. Since the wave propagates in both directions perpendicular to the fingers, there is a loss of energy (insertion loss) of 50% from this transducer even when at least the optimum number of finger pairs is used. The surface wave is preferably a Rayleigh wave because they are the most convenient to use.

The acoustic surface wave is received by surface wave receiving transducer 10, also mounted on the surface of the crystal. This transducer may also be any type of surface wave receiving transducer, although an interdigitated transducer is preferred as it works very well. Transducer 10, of a similar construction to transducer 3, has fingers 11 connected by bar 12, which alternate with fingers 13 connected by bar 14. The signal is received through leads 15 and 16 attached to bars 12 and 14 respectively. Transducers 3 and 10 are typically made by vapor depositing a metal such as gold or aluminum onto the crystal.

DEVICES

A delay line is used in various signal processing equipment, for example, for comparing a first signal to a second signal which arrives at a later time. The delay, or transit time, may be determined by dividing the center-to-center separation of the two transducers by the velocity of the surface wave. In a simple delay line, both the surface wave generating transducer and the surface wave receiving transducer may take the form of transducers 3 and 10 in the drawing.

A filter may be used, for example, in an oscillator to maintain a signal of a predetermined frequency. The peak signal wavelength which is passed through the filter is equal to twice the distance between the centers of a finger pair, for example, fingers A and B in the drawing. The peak signal frequency, of course, is equal to peak signal wavelength divided by the speed of the wave. For interdigitated transducers, the bandwidth of the surface wave which is generated or received is equal to the inverse of the number of finger pairs. Thus, a filter can permit only a narrow band of a predetermined frequency to pass if a large number of finger pairs is used with the finger spacing required for the desired frequency.

An FM discriminator receives a signal which varies in frequency from $f_1$ to $f_2$ about a mean frequency $f_0$. It produces a signal whose amplitude is proportional to the difference frequencies $f_0 - f_1$, and $f_0 - f_2$. In the drawing, the incoming signal in lines 8 and 9 enters transducers 3 and generates a surface wave in the crystal. The finger spacing of transducer 3 is set to generate a wave at a frequency $f_0$, halfway between $f_1$ and $f_2$, but the bandwidth of the transducer is broad enough to generate waves at frequencies $f_1$ and $f_2$ as well. In an FM discriminator transducer 10 would be replaced by two transducers having the same ground. One transducer would receive the lower frequency $f_1$ and the other would receive the higher frequency $f_2$. For additional information on FM discriminators see U.S. Pat. No. 3,626,309.

THE CRYSTALS

The crystals of this invention are optically isotropic, piezoelectric, and crystallographically cubic. They have the CsCl structure, $I\bar{4}3m$, with two formula units per unit cell, and their diffraction aspect derived from X-ray data is I***. Crystals having the optimum properties are believed to be slightly non-stoichiometric probably high in sulfur. For this reason, crystals within about 5% of stoichiometric are contemplated within the scope of this invention. Mixtures of the two crystals, such as $Tl_3TaS_2Se_2$, are also contemplated within the scope of this invention.

For a useful acoustic surface wave device, the crystal must have at least one surface suitable for surface wave propagation which is at least 1 mm long; a typical length is about ½ to about 3 cm. A surface which is suitable for acoustic surface wave propagation is one which is smooth to within one-hundredth of the acoustic wavelength. A suitable crystal should also be at least about 1 mm wide, and preferably at least about ½ cm wide, in order to provide a sufficient surface for mounting the transducers, and at least about 1 mm thick so that it is not too fragile to handle.

The following example of the preparation and testing of an acoustic surface wave device using crystals of $Tl_3TaS_4$ and $Tl_3TaSe_4$ further illustrates this invention.

EXAMPLE

A quantity of thallium was washed in hot distilled water and a quantity of tantalum was washed in dilute mineral acid. Using the washed elements the following quantities of very pure elements were carefully weighed out:

| Composition | Elements | | | |
|---|---|---|---|---|
| | Tl | Ta | S | Se |
| $Tl_3TaS_4$ | 6.9281 | 2.0381 | 1.4564 | |
| $Tl_3TaSe_4$ | 6.1311 | 1.8095 | | 3.1742 |

The elements were mixed and placed in a fused silica ampoule. The ampoule was evacuated, sealed, and heated to over about 800°C for three days with intermittent shaking. The material was cooled, broken up, placed into a crystal-growing tube, and sealed under 0.8 atmospheres of pure, dry argon. Using the Starkbarger technique the crystal-growing tube was slowly (11.9 mm/day for $Tl_3TaS_4$ and 16.7 mm/day for $Tl_3TaSe_4$) lowered from a temperature zone above the crystal melting point (about 545°C for $Tl_3TaS_4$ and about 600°C for $Tl_3TaSe_4$) to temperature zone below its melting point at a temperature gradient of 8 to 14 C/mm. The crystals were annealed after growth by cooling them slowly to room temperature. The resulting crystals were 0.8 cm in diameter and 2.5 cm long. The $Tl_3TaS_4$ crystal was red and the $Tl_3TaSe_4$ crystal was dark brown. They were cut to about 1 cm long by ½ cm wide by ½ cm thick and was polished to a smooth, flat surface.

Gold interdigitated acoustic wave generating and receiving transducers were vapor deposited on the surface. The transducers were about ½ cm apart and each had 17 ½ finger pairs. The finger spacing was 25 microns. Wire leads were soldered to the transducers and the device was tested by sending an 8 ½ MHz signal of 1 volt into the generating transducer and detecting the signal at the receiving transducer. The following properties were observed.

| Crystal | Orientation | Velocity ($\times 10^5$ cm/sec) | Delay (sec/mm) | Temp. Coeff. of Delay (ppm/°C) | Coupling Strength $K^2$ (%) | Optimum Finger Pairs Nopt | Effective Dielectric Constant |
|---|---|---|---|---|---|---|---|
| $Tl_3TaS_4$ | (110)(110) | 0.87 | 1.15 | −163 | 3.46 | 5.0 | 13.4 |
| $Tl_3TaSe_4$ | (001)(110) | 0.87 | 1.15 | ~0 | −.48 | 13.0 | 10.1 |

It is expected that the (001), (110) orientation of the $Tl_3TaS_4$ crystal will have a higher coupling strength and a lower temperature coefficient of delay than does the (110), (110) direction.

In explanation of the above table, the orientation is the face normal followed by the surface wave propagation direction. The temperature coefficient of delay is equal to $(1/\tau)(\delta/\delta T)$ where $\tau$ is the transit time of a surface wave between two points on the surface (the delay) and T is the temperature.

In addition, to the above-described crystals large (i.e., $> 0.5 \times 0.5 \times 1$ cm) single crystals of the compositions $Tl_3TaS_{4.005}$, $Tl_3TaS_{4.02}$, $Tl_3TaSe_{4.02}$ and $Tl_3TaS_2Se_2$ were also grown. It should be noted that while the compositions given for the crystals are the compositions that the proportions of starting materials are expected to produce rather than the composition of the crystals as analyzed, the actual crystal compositions are believed to be within about 1% of the compositions given.

What we claim is:
1. An acoustic surface wave device comprising
   1. a single crystal selected from the group consisting of $Tl_3TaS_4$, $Tl_3TaSe_4$, and mixtures thereof, within about 5% of stoichiometric, said crystal having at least one surface suitable for the propagation of surface waves;
   2. a surface wave generating transducer mounted on said surface; and
   3. a surface wave receiving transducer mounted on said surface positioned to receive surface waves emanating from said surface wave generating transducer.
2. An acoustic surface wave device according to claim 1 wherein said crystal is $Tl_3TaS_4$.
3. An acoustic surface wave device according to claim 1 wherein said crystal is $Tl_3TaSe_4$.
4. An acoustic surface wave device according to claim 3 wherein said surface of said single crystal is in the 001 direction and said surface waves are propagated in the 110 direction.
5. An acoustic surface wave device according to claim 1 wherein said transducers are interdigitated transducers.
6. An acoustic surface wave device according to claim 1 wherein said crystal is at least 1 mm thick and said surface is at least 1 mm by 1 mm.
7. An acoustic surface wave device according to claim 6 wherein said surface is at least ½ cm by ½ cm.
8. A method of delaying an electrical signal comprising:
   1. passing said signal through a surface wave generating transducer mounted on a surface of a single crystal selected from the group consisting of $Tl_3TaS_4$, $Tl_3TaSe_4$ and mixtures thereof, within about 5% of stoichiometric, said surface being suitable for the propagation of surface waves; and
   2. receiving said signal from a surface wave receiving transducer mounted on said surface positioned to receive surface waves emanating from said surface wave generating transducer.
9. A method according to claim 8 wherein said surface wave is a Rayleigh wave.
10. A method according to claim 8 wherein said crystal is $Tl_3TaS_4$.
11. A method according to claim 8 wherein said crystal is $Tl_3TaSe_4$.
12. A method according to claim 11 wherein said surface of said single crystal is in the 001 direction and said surface waves are propagated in the 110 direction.
13. A method according to claim 8 wherein each of said transducers is an interdigitated transducer.
14. A method according to claim 8 wherein said crystal is at least 1 mm thick and said surface is at least 1 mm by 1 mm.
15. A method according to claim 14 wherein said surface is at least ½ cm by ½ cm.

* * * * *